United States Patent [19]
Sun et al.

[11] Patent Number: 5,966,618
[45] Date of Patent: Oct. 12, 1999

[54] METHOD OF FORMING DUAL FIELD ISOLATION STRUCTURES

[75] Inventors: Yu Sun, Saratoga; Tuan D. Pham, Santa Clara; Mark T. Ramsbey, Sunnyvale; Chi Chang, Redwood City, all of Calif.

[73] Assignee: Advanced Micro Devices, Inc., Sunnyvale, Calif.

[21] Appl. No.: 09/036,288

[22] Filed: Mar. 6, 1998

[51] Int. Cl.$^6$ .................................................. H01L 21/76
[52] U.S. Cl. .......................... 438/452; 438/225; 438/297; 257/509; 257/647
[58] Field of Search ..................................... 438/405, 410, 438/439, 452, 225, 297; 257/509, 647

[56] References Cited

U.S. PATENT DOCUMENTS

| | | | |
|---|---|---|---|
| 5,110,756 | 5/1992 | Gregor et al. ............................. | 438/452 |
| 5,128,274 | 7/1992 | Yabu et al. ............................... | 438/452 |
| 5,316,966 | 5/1994 | Van Der Plas et al. ................. | 438/452 |
| 5,466,623 | 11/1995 | Shimizu et al. ......................... | 438/297 |
| 5,646,063 | 7/1997 | Mehta et al. ............................. | 438/425 |
| 5,786,264 | 7/1998 | Hwang ..................................... | 438/452 |
| 5,794,809 | 8/1998 | Gardner et al. .......................... | 438/439 |

*Primary Examiner*—Olik Chaudhuri
*Assistant Examiner*—Anh Duy Mai
*Attorney, Agent, or Firm*—Foley & Lardner

[57] ABSTRACT

A method of providing thick and thin oxide structures reduces step changes between a core region and a peripheral region on an integrated circuit. Thin LOCOS structures are provided in a core region of a flash memory device, and thick LOCOS structures are provided in a peripheral region of the flash memory device. The device and process are not as susceptible to "race track" problems, "oxide" bump problems, and "stringer" problems. The process utilizes two separate nitride or hard mask layers.

20 Claims, 7 Drawing Sheets

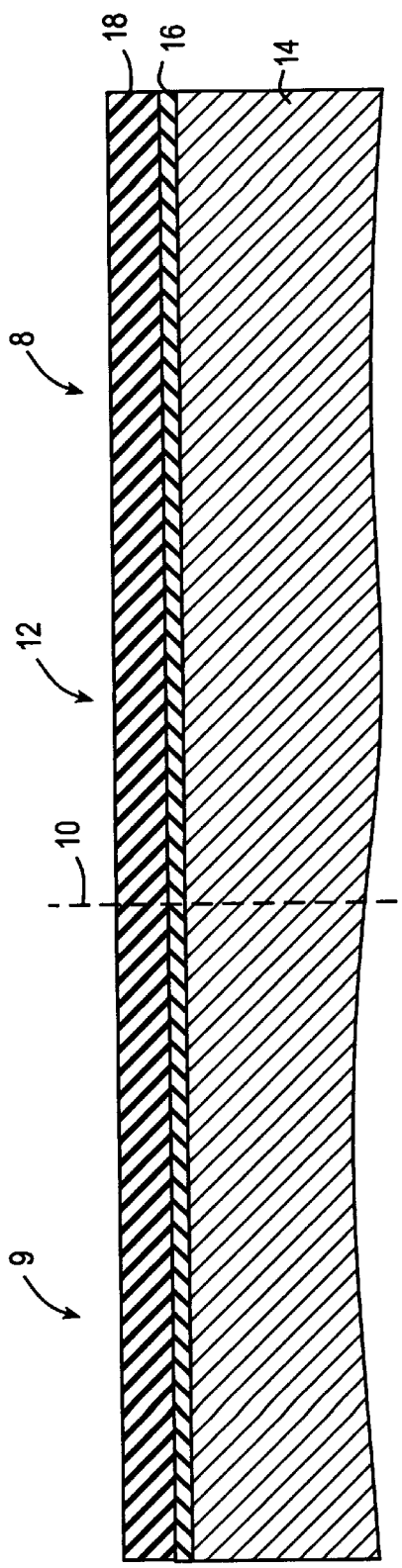
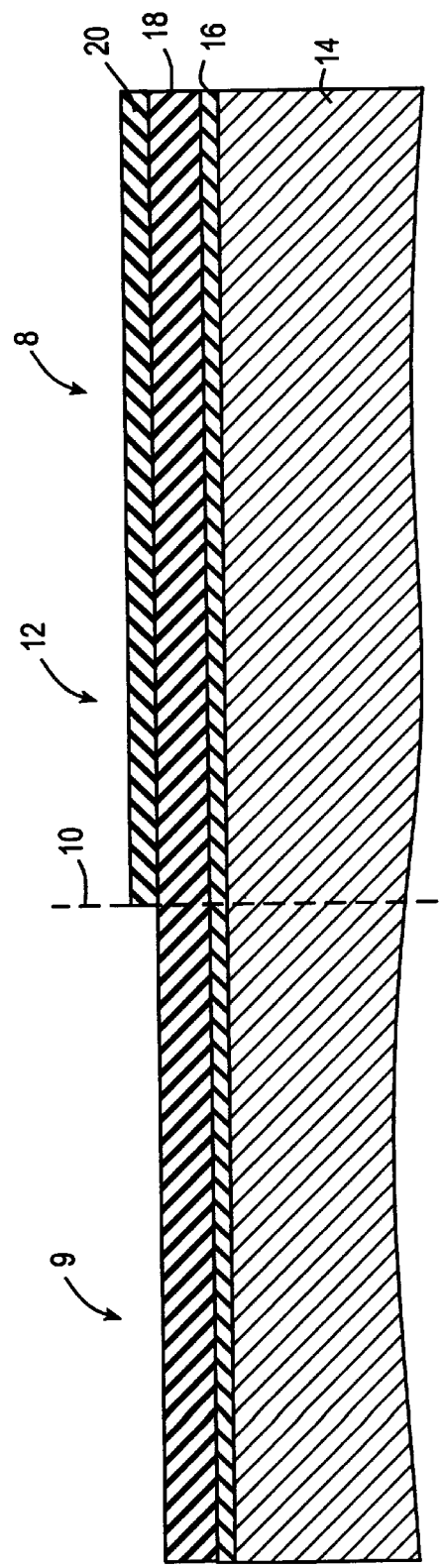

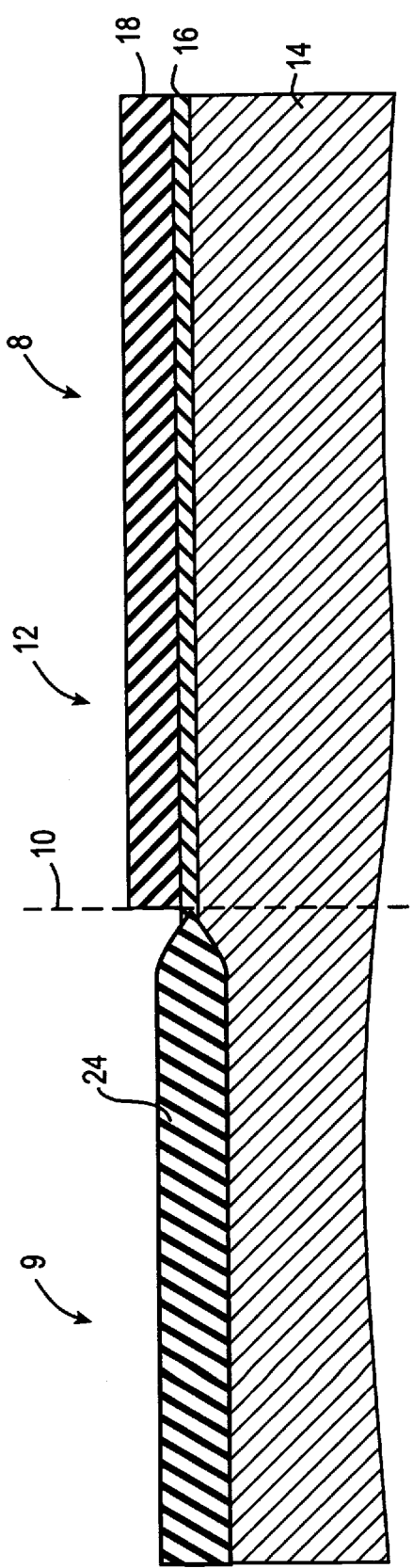
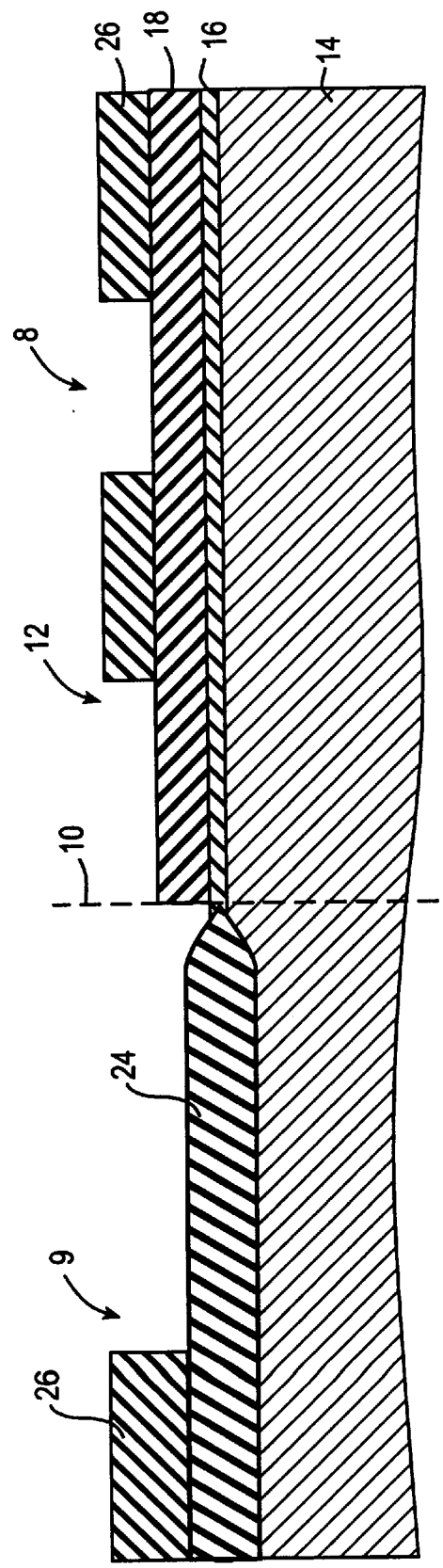

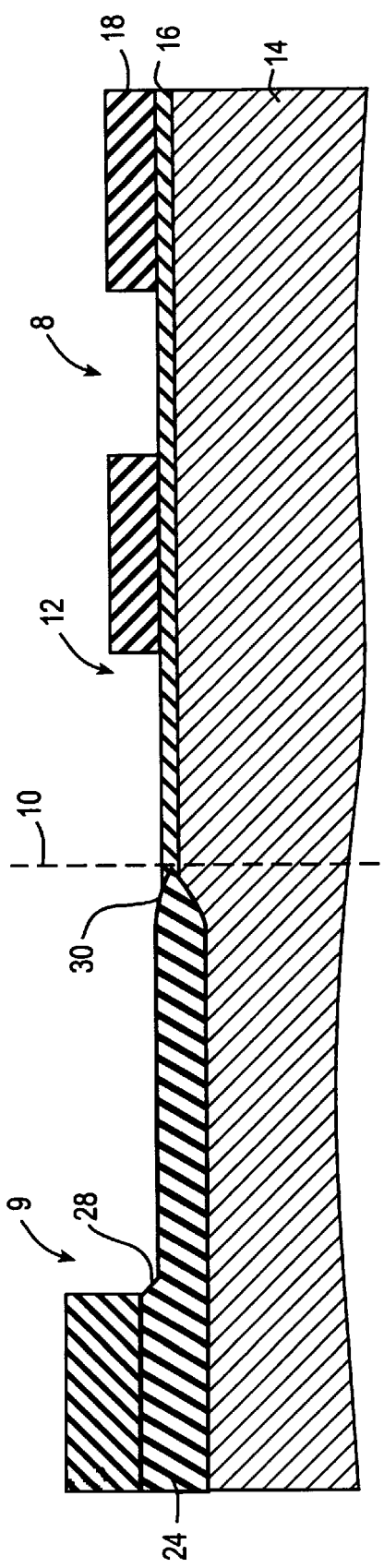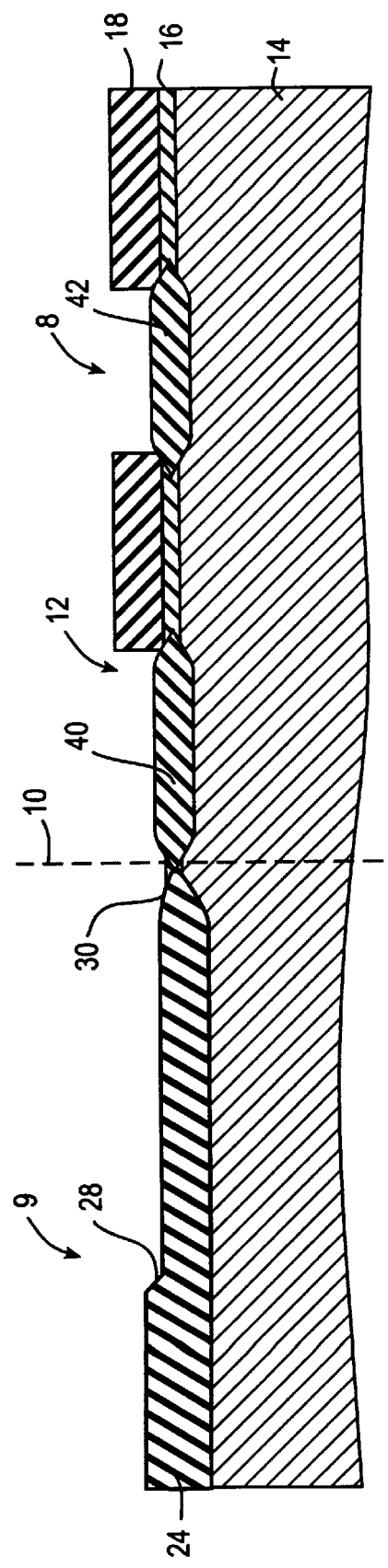

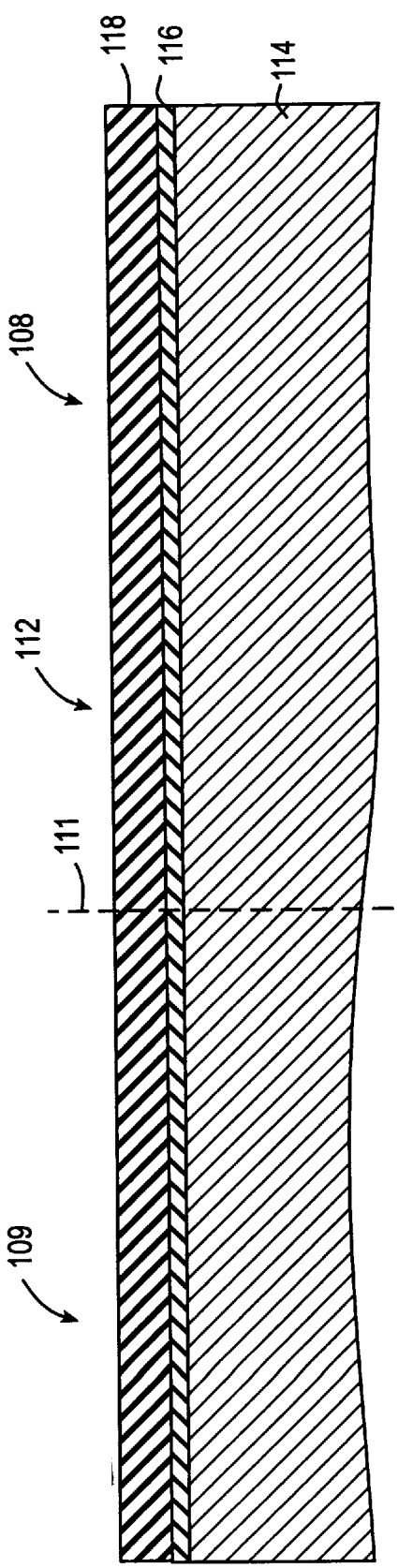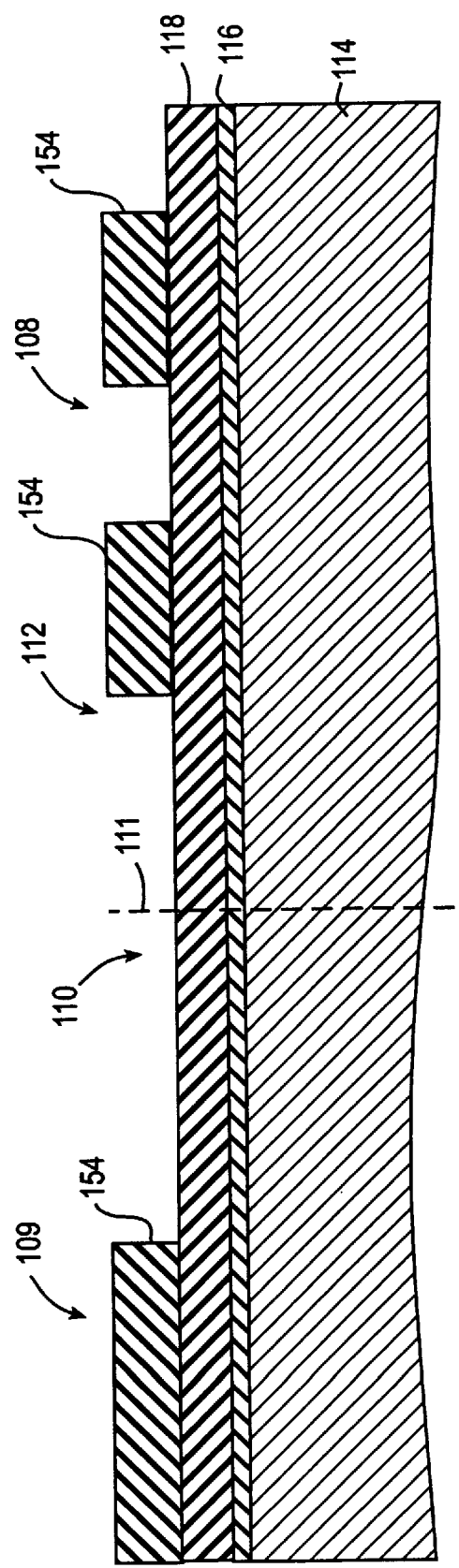

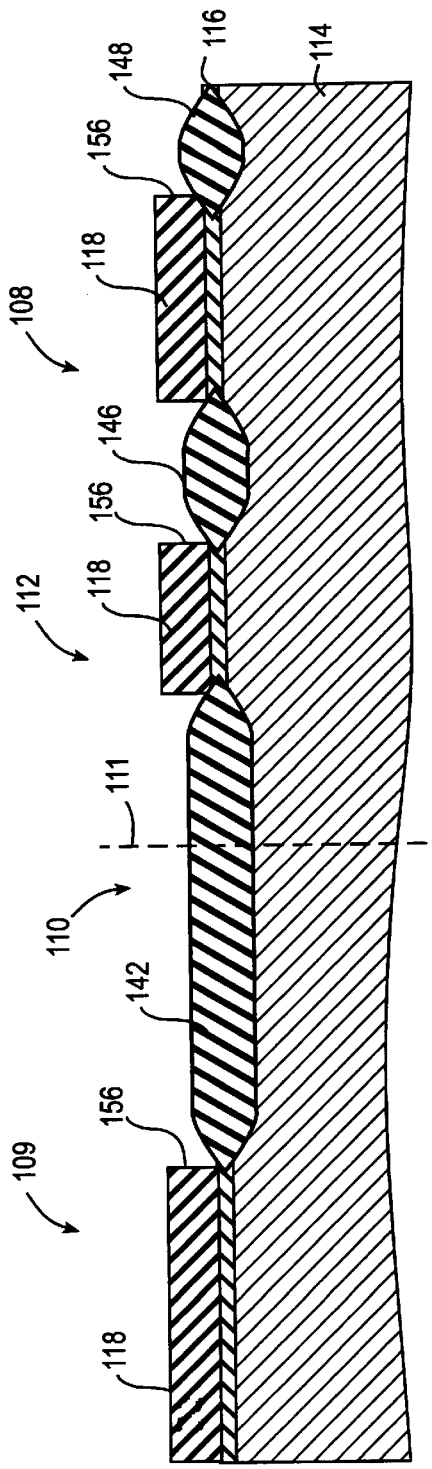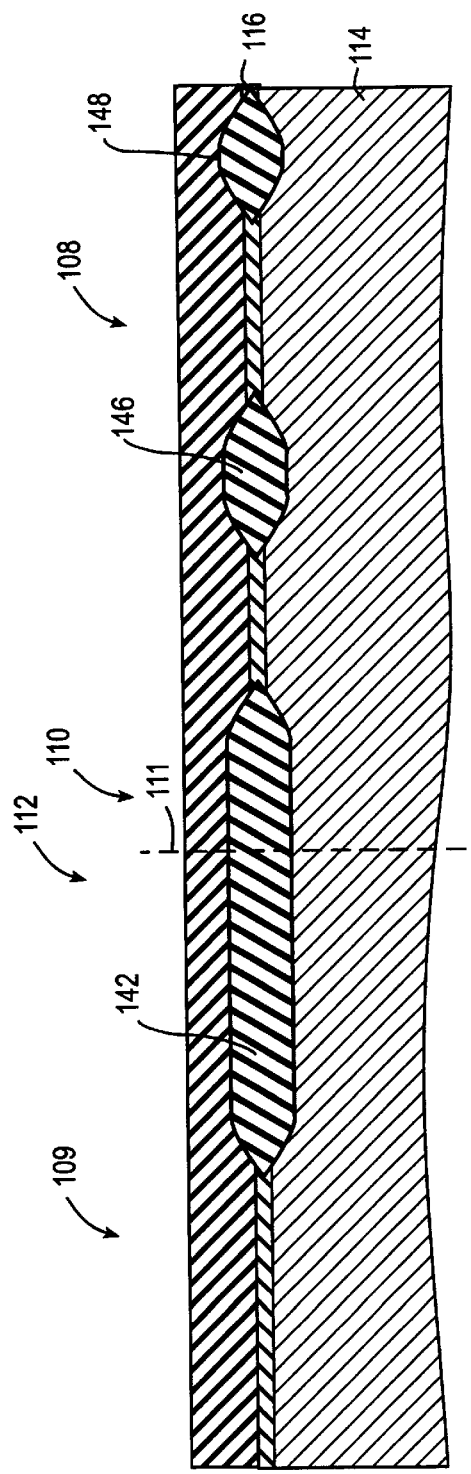

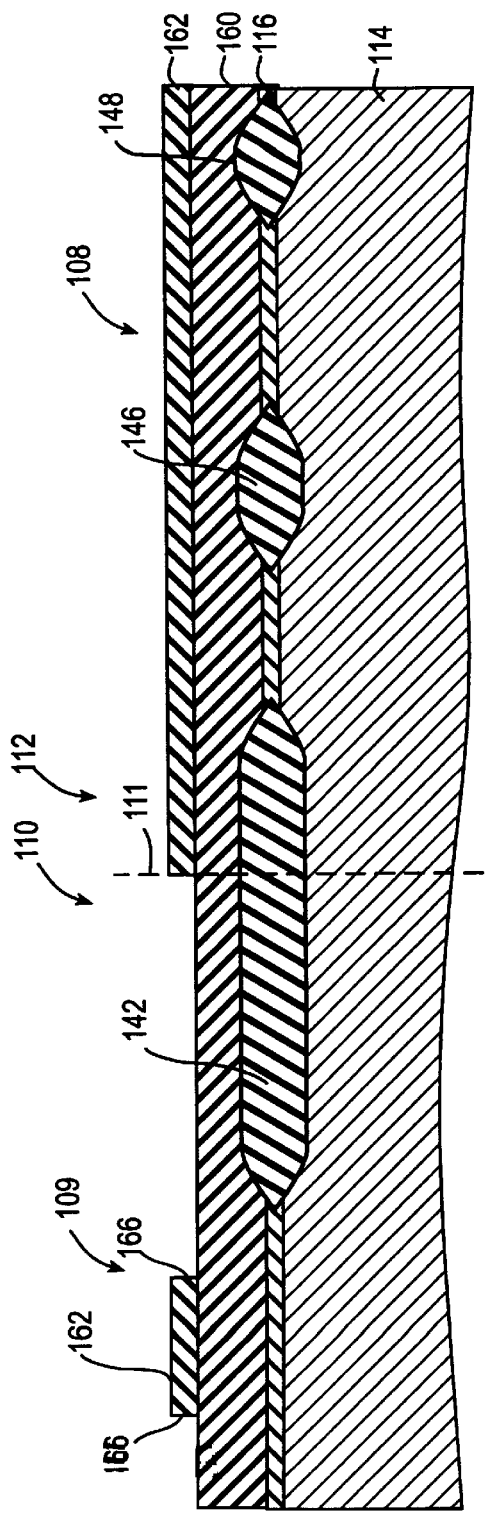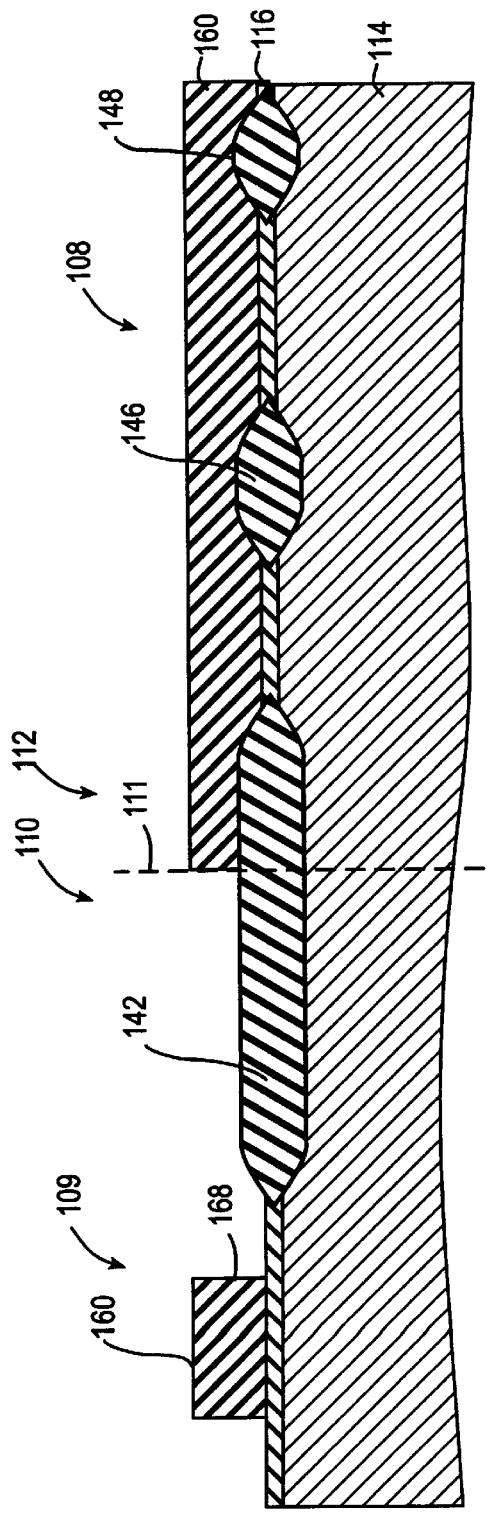

METHOD OF FORMING DUAL FIELD ISOLATION STRUCTURES

FIELD OF THE INVENTION

The present invention relates to an integrated circuit or semiconductor device. More particularly, the present invention relates to a fabrication method for creating thin and thick isolation structures on a semiconductor substrate.

BACKGROUND OF THE INVENTION

In general, semiconductor devices or integrated circuits (ICs) can utilize selective oxidation, such as, local oxidation of silicon (LOCOS) to create isolation structures. LOCOS is often employed to electrically insulate or isolate various portions or structures of the semiconductor device from other portions of the device. LOCOS typically involves growing a pad oxide or liner oxide, depositing a hard mask layer over the liner oxide, etching the hard mask layer, and growing an oxide isolation structure. The hard mask layer can be a nitride film. The oxide structure can be grown by heating the substrate.

Isolation regions or structures for semiconductor devices can vary in size depending on parameters or requirements necessary for proper electric isolation and charge carrier isolation. For example, in memory devices, such as, flash electrical erasable programmable read only memories (flash EEPROMS), larger isolation structures are needed in peripheral areas (non-core areas for input/output circuitry) of the devices where larger voltages are present. In contrast, smaller isolation structures are utilized in core areas (e.g., the memory cell array) where memory cells are packed closely together and operate at lower voltage levels. Thus, certain areas of the semiconductor device can require large isolation structures while other areas can require small isolation structures due to different voltage requirements, dopant types, increased circuit packing density, dopant concentrations, or other criteria associated with IC design.

Heretofore, semiconductor devices, such as, flash memories generally have utilized thick LOCOS structures in peripheral regions and thin LOCOS structures in core regions. The thin and thick LOCOS structures require two separate critical masks to define the oxide structures which are grown in two separate selective oxidation processes. With reference to FIGS. 1–6, a conventional process for forming thin and thick oxide structures is described as follows.

In FIG. 1, a semiconductor structure device 12 includes a core region 8 and a peripheral region 9 separated by an interface 10. Structure 12 includes a substrate or base 14, a pad oxide layer 16, and a nitride layer 18. Structure 12 is first etched in accordance with a preliminary mask or zero layer mask (not shown) for defining alignment marks.

In FIG. 2, a source drain mask layer 20 is provided over layer 18 to define source and drain regions in peripheral region 9. Layer 20 completely covers core region 8. After layer 20 is applied, structure 12 is etched to remove layer 18 from portions of region 9 in accordance with layer 20. In FIG. 3, layer 20 is stripped from structure 12, and structure 12 is oxidized to form LOCOS isolation structure 24 in accordance with a conventional LOCOS technique. During this step, layer 18 in core region 8 is also oxidized. Additionally, LOCOS structure 24 is relatively thin at boundary or interface 10 with respect to the remaining portion of peripheral region 9.

In FIG. 4, a source drain mask layer 26 is applied to define source and drain regions in core region 8 as well as isolation structures for core region 8. In FIG. 5, structure 12 is etched in accordance with layer 26 to remove portions of layer 18 in core region 8. However, due to alignment errors, portions of structure 24 close to interface 10 can be etched because layer 26 does not reach interface 10 (FIG. 4). The etching of structure 12 can thin the thickness of structure 24 in peripheral region 9. This thinning can cause a step 28 and a groove 30. The thickness of structure 24 can be less than 1300 Å at step 28. In FIG. 6, isolation structures 40 and 42 are grown in a thermal process in accordance with a conventional LOCOS technique. Step 28 and groove 30 remain on structure 10. The thickness of structure 28 can be less than 1000 Å at groove 28.

Step 28 and groove 30 can cause residue or "stringer" problems during subsequent first polysilicon, oxygen-nitride-oxygen (ONO), second polysilicon and self-aligned etched (SAE) processes. Conductive material trapped in step 28, groove 30 can create unintentional gate structures due to the thinness of structure 24 or can electrically short adjacent structures.

Additionally, during the process discussed with reference to FIGS. 1–6, layer 18 is subjected to two oxidation steps which can create "oxide bumps" on top of "birds beaks" associated with structures 40 and 42. The oxide bumps can be due to material surface stress of layer 18 which is caused by the dual oxidation process associated with the formation of structures 24, 40 and 42. Step 28 can also create a "race track" topography problem related to the difference in thickness of structure 24 at interface 10. The race track topography problem is manifested when photoresist is provided on structure 12 and includes grooves or lanes in a race track form.

Thus, there is a need for a semiconductor device including thick and thin isolation structures with minimal step changes in an interface region between a peripheral region and a core region. Further, there is a need for a method of manufacturing an integrated circuit with thick and thin isolation structures which does not stress a hard mask layer in the core region. Further still, there is a need for a method of fabricating thick and thin LOCOS structures which is less susceptible to "race track" problems, "stringer" problems, and "oxide bump" problems.

SUMMARY OF THE INVENTION

The present invention relates to a method of fabricating an integrated circuit having a core area, an interface area and a peripheral area. The interface area is between the core area and the peripheral area, and the peripheral area has at least one thick LOCOS structure. The core area has at least one thin LOCOS structure. The thin LOCOS structure and the thick LOCOS structure are formed in a semiconductor substrate. The semiconductor substrate includes a first hard mask layer disposed above the substrate. The method includes a first etch resist layer over the first hard mask layer, etching the first hard mask layer in accordance with the first etch resist layer, growing the thin LOCOS structure, stripping the first hard mask layer, and providing a second hard mask layer over the core region. The first etch resist layer defines the thin LOCOS structure.

The present invention further relates to a method of fabricating at least one first isolation region and at least one second isolation region on a semiconductor substrate. The semiconductor substrate includes a pad oxide layer disposed above the substrate and a first hard mask layer disposed above the pad oxide layer. The method includes the steps of etching the first hard mask layer, forming the first isolation region by oxidizing the substrate, removing the first hard mask layer, and providing a second hard mask layer.

The present invention still further relates to a method of fabricating a semiconductor device on a semiconductor, the method includes providing a first nitride layer over a semiconductor substrate, selectively etching the first nitride layer at a plurality of first locations, forming a plurality of first oxide isolation structures at the first locations, providing a second nitride layer over the semiconductor substrate, selectively etching the second nitride layer at a plurality of second locations, and forming a plurality of second oxide isolation structures at the second locations.

According to one exemplary aspect of the present invention, selective oxidation structures are provided in a core region and a peripheral region of an integrated circuit (IC). Thick oxidation structures are provided in the peripheral region, and thin oxidation structures are provided in the core region. Two separate hard mask layers, such as, nitride layers, are utilized to define the thin and thick oxidation structures. The thin oxidation structures in the core region are formed first followed by the thick oxidation structures in the peripheral region.

In accordance with another exemplary aspect of the present invention, selective oxidation by LOCOS is utilized for thick and thin LOCOS isolation regions in a peripheral region and core region, respectively, of a semiconductor substrate. An interface region between the core region and peripheral region preferably has relatively even isolation (e.g., without significant step downs or grooves) due to the advantageous fabrication technique. The advantageous process reduces residue or "stringer" problems. Further, the advantageous fabrication process is less susceptible to "oxide bumps" formed on oxidation structures in the core region and reduces the potential for photo resist "race track" problems. In yet another advantage associated with an embodiment of the present invention, boron segregation into the field oxide is reduced or eliminated because the integrated circuit is implanted with boron after the formation of the field oxide.

BRIEF DESCRIPTION OF THE DRAWINGS

Preferred exemplary embodiments of the present invention will hereafter be described in conjunction with the appended drawings, wherein like numerals denote like elements, and:

FIG. 1 is a cross-sectional view of a semiconductor device illustrating a first step in a conventional LOCOS formation process;

FIG. 2 is a cross-sectional view of the semiconductor device shown in FIG. 1 illustrating a second step in the conventional LOCOS formation process;

FIG. 3 is a cross-sectional view of the semiconductor device shown in FIG. 2 illustrating a third step in the conventional LOCOS formation process;

FIG. 4 is a cross-sectional view of the semiconductor device shown in FIG. 3 illustrating a fourth step in the conventional LOCOS formation process;

FIG. 5 is a cross-sectional view of the semiconductor device shown in FIG. 4 illustrating a fifth step in the conventional LOCOS formation process;

FIG. 6 is a cross-sectional view of the semiconductor device shown in FIG. 5 illustrating a sixth step in the conventional LOCOS formation process;

FIG. 8 is a cross-sectional view of the semiconductor structure shown in FIG. 7 illustrating a first step in the method utilized to manufacture the semiconductor structure;

FIG. 9 is a cross-sectional view of the semiconductor structure shown in FIG. 8 illustrating a second step in the method utilized to manufacture the semiconductor structure;

FIG. 10 is a cross-sectional view of the semiconductor structure shown in FIG. 9 illustrating a third step in the method utilized to manufacture the semiconductor structure;

FIG. 11 is a cross-sectional view of the semiconductor structure shown in FIG. 10 illustrating a fourth step in the method utilized to manufacture the semiconductor structure;

FIG. 12 is a cross-sectional view of the semiconductor structure shown in FIG. 11 illustrating a fifth step in the method utilized to manufacture the semiconductor structure; and FIG. 13 is a cross-sectional view of the semiconductor structure shown in FIG. 12 illustrating a sixth step in the method utilized to manufacture the semiconductor structure.

DETAILED DESCRIPTION OF PREFERRED EXEMPLARY EMBODIMENTS

Figure 7:
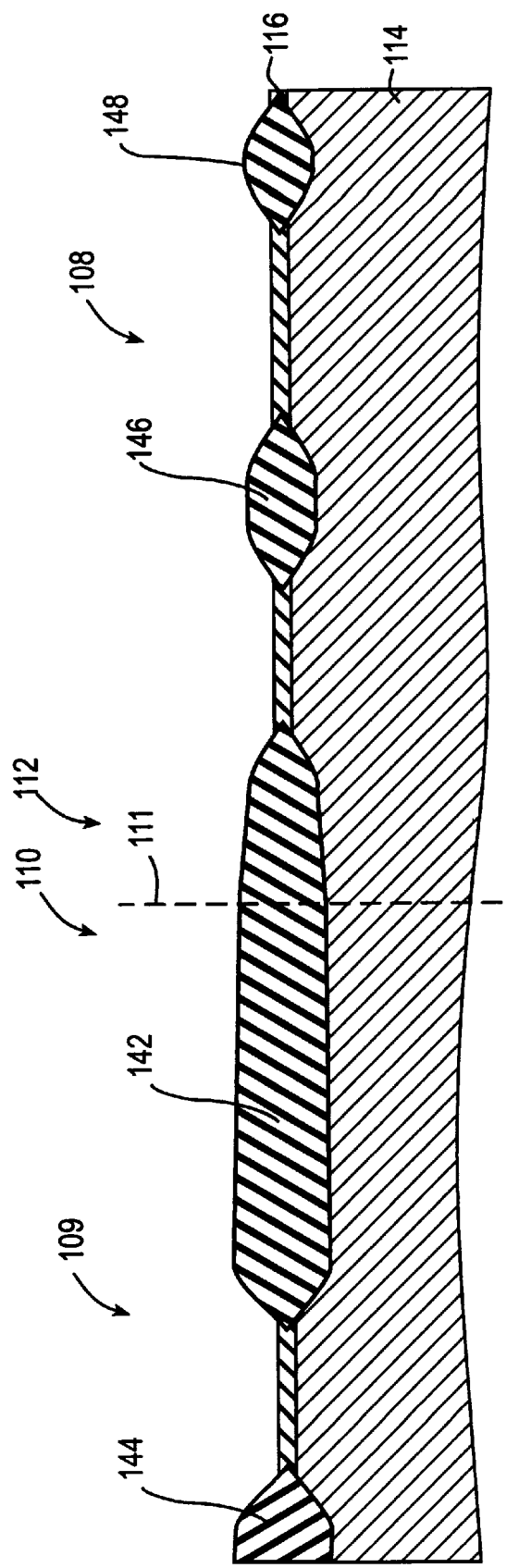
FIG. 7 is a cross-sectional view of a semiconductor structure including thin isolation structures in a core region and thick isolation structures in a peripheral region in accordance with an exemplary embodiment of the present invention.

With reference to FIG. 7, a semiconductor device or structure 112 includes a core region 108, an interface region 110, and a peripheral region 109. Structure 112 includes a substrate or a base 114, an oxide isolation structure 142, an oxide isolation structure 144, an oxide isolation structure 146, and an oxide isolation structure 148.

Structure 112 can be any type of semiconductor device or portion thereof made from any of the various semiconductor processes, such as, complimentary metal oxide semiconductor (CMOS) process, bipolar process, or other semiconductor processes. Structure 112 is shown in FIG. 7 before other components and structures, such as, polysilicon layers, insulating layers, and metal layers are provided.

Semiconductor structure 112 may be an entire or a portion of an integrated circuit (IC) including a multitude of electronic components. Base 114 of semiconductor structure 112 is preferably silicon or other semiconductor material and can be doped with P-type dopants or N-type dopants. Structure 112 can include CMOS transistors fabricated in N-type and P-type wells.

Preferably, structure 112 is at least a portion of a memory device, such as, a flash EEPROM. The memory device includes memory cells provided in core region 108 and input/output or drive circuitry in peripheral region 109. Core region 108 is a low voltage region (e.g., 2.7V or less). Peripheral region 109 is preferably a higher voltage region (e.g., 3.3V or higher) including drive circuitry. Interface region 110 is adjacent a border 111 between regions 108 and 109.

Core region 108 includes isolation structures 146 and 148, and peripheral region 109 includes isolation structures 142 and 144. Structures 146 and 148 are preferably thin LOCOS structures having a thickness of 2,000 angstroms (Å). Structures 142 and 144 are preferably thick LOCOS structures having a thickness of 4,000 Å. Structure 142 extends across interface region 110 and into region 108. Structures 142, 144, 146 and 148 are grown in selective thermal field oxidation processes.

System parameters and design requirements can define the various dimensions for structures 142, 144, 146 and 148.

For example, as the size and spacing of transistors integrated within and above base 114 decrease, the width and depth of structures 142, 144, 146 and 148 can likewise decrease. Further, as voltage parameters change for the functional units integrated in base 114, the dimensional relationships of isolation structures 142, 144, 146 and 148 can also change. Thus, system configurations and fabrication parameters associated with the design of structure 112 can serve to define the dimensions of structures 142, 144, 146 and 148, as well as, regions 108, 109 and 110.

The fabrication of semiconductor structure 112 is described in more detail as follows with reference to FIGS. 7–13. In FIG. 8, semiconductor structure 112 includes substrate layer or base 114, an oxide film or pad oxide layer 116, and a nitride layer 118. Base 114 is preferably silicon (Si) and can be doped with phosphorous for N-type wells or boron for P-type wells and is significantly thicker than layers 116 and 118. Pad oxide layer 116 is grown on top of base 114 to a thickness of approximately 150–250 Å by a thermal process. Nitride layer 118 is deposited as a 1,700 Å thick layer by chemical vapor deposition (CVD) on top of pad oxide layer 116. Alternatively, layers 116 and 118 may be deposited by physical vapor deposition (PVD), sputtering deposition, collimated sputtering deposition, dipping, evaporating, or other application techniques.

Nitride layer 118 is a hard mask layer. Layer 118 is comprised of silicon nitride ($Si_3N_4$) and serves to prevent oxidation of underlying substrate 114. Layer 118 is also an anti-reflective coating. Pad oxide layer 116 provides stress relief between base 114 and layer 118 for structure 112. Alternatively, layer 118 can be any hard mask layer.

With reference to FIG. 9, an etch resist layer 152 is selectively applied on top of layer 118. Etch resist layer 152 is preferably a photoresist layer which defines spacings 154 for structures 142, 146 and 148. Unlike conventional processes, well regions are not yet defined in regions 108 and 109. Structure 112 can be etched by dry etching (e.g., plasma etching) to form spacings 156 in layer 118 (FIG. 10). This etching of structure 112 can also serve to define alignment marks for structure 112, thereby eliminating the need for a zero mask layer. Layer 152 (FIG. 9) is removed or stripped from structure 112. With reference to FIG. 10, structure 112 is oxidized to form structures 142, 146, and 148 in accordance with a LOCOS process. Structures 142, 146 and 148 are grown to a 1000 Å to 3000 Å thickness, preferably 2000 Å to 2500 Å or less. After layer 152 is removed, nitride layer 118 is removed or stripped. Layer 118 can be removed by a hot phosphoric acid wet strip process, other etching processes, or other removal processes.

With reference to FIG. 11, after layer 118 is stripped, wells for core region 108 and peripheral region 109 are defined by well masking, well implant and well driving steps. After the wells are defined, a hard mask or nitride layer 160 is deposited over structures 142, 146 and 148 and layer 116. Layer 160 is preferably similar to layer 118 (in FIG. 10) and has a thickness of 1700 Å.

With reference to FIG. 12, an etch resist layer 162 is provided over layer 160. Etch resist layer 162 is preferably a photoresist layer which is selectively provided to define structure 142 and structure 144 with spacings 166. Layer 162 preferably completely covers region 108.

With reference to FIG. 13, layer 160 is etched to define spacings 168. After layer 160 is etched by dry etching and layer 162 is stripped, structure 112 undergoes a thermal process in accordance with a LOCOS technique to form structures 144 and 142 (FIG. 7). Preferably, structures 144 and 142 are grown to a thickness of 4000 Å in peripheral region 109.

Layer 160 in region 108 prevents further growth of structures, 146 and 148 during this second LOCOS process. Structure 142 grows to an edge 168 (FIG. 13) of layer 160. After structures 142 and 144 are grown, layer 160 is stripped by a hot phosphoric acid wet strip process. Alternatively, other etching or removal techniques can be utilized to remove layer 160.

With reference to FIGS. 6 and 7 structures 144 and 142 (FIG. 7) have a relatively even thickness when compared to structure 24 (FIG. 6). Structure 142 (FIG. 7) has a relatively even thickness throughout interface region 110. The use of two hard mask layers 118 and 160 advantageously eliminates or reduces residue or stringer problems associated with the conventional process discussed with reference to FIGS. 1–6. Accordingly, structure 112 can optimize isolation structure thicknesses associated with structures 142, 144, 146 and 148 because overetching problems are significantly reduced.

Additionally, source drain definitions in core region 108 can be used as a target for follow-up deep N-well, P-well and N-well implant masks, thereby eliminating the need for a zero layer mask. Further still, the process discussed with reference to FIGS. 7–13 reduces the "oxide" bump concern because each nitride layer 118 and 160 is only subjected to a single oxidation process. Therefore, the method advantageously eliminates material surface stress which can cause field edge defects in core region 8 due to oxidized nitride in core region 108. Further, the method reduces non-uniform "race track" problems due to topographic differences in field oxide thickness of structure 142 at interface region 110.

It is understood that, while the detailed drawings and specific examples given describe preferred exemplary embodiments of the present invention, they are for the purpose of illustration only. The present invention is not limited to the precise details, methods, materials, and conditions disclosed. For example, although dry etching and wet stripping are suggested, material may be removed in other processes. Further, although particular dimensions are mentioned, other dimensions associated with the isolation regions may be utilized. The dimensions, sizes, thicknesses, and shapes shown in the drawings are shown only in an exemplary fashion. The various layers, trenches, and lines may have different thicknesses and geometries depending on integrated circuit (IC) designs and process technologies.

What is claimed is:

1. A method of fabricating an integrated circuit having a core area, an interface area and a peripheral area, the interface area being between the core area and the peripheral area, the peripheral area having least one thick locos structure, the core area having at least one thin locos structure, the thin locos structure and the thick locos structure being formed in a semiconductor substrate, the semiconductor substrate including a first hard mask layer disposed above the substrate, the method comprising:

providing a first etch resist layer over the first hard mask layer, the first etch resist layer defining the thin locos structure;

etching the first hard mask layer in accordance with the first etch resist layer;

growing the thin locos structure;

stripping the first hard mask layer; and providing a second hard mask layer over the core region for forming the thick locos structure over whereby the thick locos structure in the peripheral area is formed after the thin locos structure in the core area.

2. The method of claim 1, further comprising:

providing a second etch resist layer over the second hard mask layer, the second etch resist layer defining the thick locos structure; and etching the second hard mask layer in accordance with the second etch resist layer.

3. The method of claim 2, further comprising:

growing the thick LOCOS structure.

4. The method of claim 3, further comprising:

stripping the second hard mask layer.

5. The method of claim 3, wherein the first and second hard mask layers are comprised of nitride.

6. The method of claim 1, wherein the integrated circuit is a memory circuit.

7. The method of claim 1, wherein the etching the first hard mask layer leaves alignment marks.

8. A method of fabricating at least one first isolation region in a first area and at least one second isolation region in a second area on a semiconductor substrate, the first isolation region being thinner than the second isolation region, the semiconductor substrate including a pad oxide layer disposed above the substrate and a first hard mask layer disposed above the pad oxide layer, the method comprising:

etching the first hard mask layer;

forming the first isolation region by heating the substrate;

removing the first hard mask layer; and providing a second hard mask layer for the second isolation region, whereby the first isolation region is formed before the second isolation region.

9. The method of claim 8, further comprising:

etching the second hard mask layer; and forming the second isolation region by heating the substrate.

10. The method of claim 9, further comprising:

stripping the second hard mask layer.

11. The method of claim 10, wherein the first and second hard mask layers are nitride layers.

12. The method of claim 11, wherein the semiconductor substrate includes a core region and a peripheral region, the second isolation region is a thick LOCOS structure being located in the peripheral region and the first isolation region is a thin LOCOS structure being located in the core region.

13. The method of claim 12, wherein the semiconductor substrate includes a memory circuit.

14. The method of claim 13, wherein the memory circuit is a flash memory circuit.

15. A method of fabricating a semiconductor device on a semiconductor substrate, the method comprising:

providing a first nitride layer over a semiconductor substrate;

selectively etching the first nitride layer at a plurality of first locations;

forming a plurality of first oxidized isolation structures at the first locations;

providing a second nitride layer over the semiconductor substrate;

selectively etching the second nitride layer at a plurality of second locations; and forming a plurality of second oxidized isolation structures at the second locations after forming the first oxidized isolation structure, whereby the second isolation structures are thicker than the first isolation structures.

16. The method of claim 15, further comprising:

removing the first nitride layer before providing the second nitride layer.

17. The method of claim 15, wherein the first and second nitride layers are provided by chemical vapor deposition.

18. The method of claim 15, wherein the semiconductor substrate is for a memory circuit including a core region and a peripheral region, the second oxidized isolation structures being located in the peripheral region and the first oxidized isolation structures being located in the core region.

19. The method of claim 18, wherein the semiconductor substrate further includes an interface region between the core region and the peripheral region, whereby interface oxide structures in the interface region have a smoother top surface when compared to a conventional process.

20. The method of claim 18, wherein the memory circuit is a flash memory circuit.

* * * * *

UNITED STATES PATENT AND TRADEMARK OFFICE
CERTIFICATE OF CORRECTION

PATENT NO. : 5,966,618

DATED : 10/12/99

INVENTOR(S) : Sun et al.

It is certified that error appears in the above-identified patent and that said Letters Patent is hereby corrected as shown below:

Column 2, line 17-18, delete "step 28, groove 30" and insert --step 28 or groove 30--

Column 3, line 34, delete "photo resist" and insert --photoresist--.

Signed and Sealed this

Sixth Day of June, 2000

*Attest:*

Q. TODD DICKINSON

*Attesting Officer*  *Director of Patents and Trademarks*